(12) United States Patent
Sugihara

(10) Patent No.: US 10,091,920 B2
(45) Date of Patent: Oct. 2, 2018

(54) SURFACE MOUNT DEVICE FOR CONTROL OF HOLDING AND MOVING PRINTED CIRCUIT BOARD IN THE PRIORITY ORDER

(71) Applicant: FUJI CORPORATION, Chiryu (JP)

(72) Inventor: Kohei Sugihara, Nishio (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 15/501,229

(22) PCT Filed: Aug. 6, 2014

(86) PCT No.: PCT/JP2014/070700
§ 371 (c)(1),
(2) Date: Feb. 2, 2017

(87) PCT Pub. No.: WO2016/020998
PCT Pub. Date: Feb. 11, 2016

(65) Prior Publication Data
US 2017/0223880 A1    Aug. 3, 2017

(51) Int. Cl.
*H05K 13/00* (2006.01)
*H05K 13/04* (2006.01)
*H05K 13/02* (2006.01)

(52) U.S. Cl.
CPC ....... *H05K 13/0061* (2013.01); *H05K 13/027* (2013.01); *H05K 13/0495* (2013.01)

(58) Field of Classification Search
CPC .................. H05K 13/0061; H05K 13/0495
See application file for complete search history.

(56) References Cited

U.S. PATENT DOCUMENTS 5,321,885 A * 6/1994 Hino ............... B23P 21/004
                                                          209/573
5,452,509 A * 9/1995 Suzuki ............ H05K 13/0408
                                                          29/740

(Continued)

FOREIGN PATENT DOCUMENTS

JP   6-216578 A   8/1994
JP   8-167796 A   6/1996

(Continued)

OTHER PUBLICATIONS

Extended European Search Report dated Sep. 8, 2017 in Patent Application No. 14899155.7.

(Continued)

*Primary Examiner* — Ramesh Patel
(74) *Attorney, Agent, or Firm* — Oblon, McClelland, Maier & Neustadt, L.L.P.

(57) ABSTRACT

A board work device includes a housing device, a holding device, a moving device, a first lane and a second lane, a corresponding relationship acquisition device, a priority order acquisition device, and a control device. The holding device exchangeably holds a board work tool that performs a board work on a board. The corresponding relationship acquisition device acquires a corresponding relationship between the types of the board work tool and each of the multiple board works for each of the boards. The control device controls the holding device and the moving device such that, when performing the board work based on the acquired corresponding relationship, in a predetermined case, the board work that is capable of being performed in the other lane is performed without exchanging the board work tool currently being held.

6 Claims, 5 Drawing Sheets

(56) References Cited

U.S. PATENT DOCUMENTS

| | | | | |
|---|---|---|---|---|
| 5,517,748 A * | 5/1996 | Park | ............... | H05K 13/0061 |
| | | | | 29/741 |
| 5,822,210 A * | 10/1998 | Kobayashi | ............ | H01L 22/20 |
| | | | | 257/E21.525 |
| 6,145,190 A * | 11/2000 | Shin | ............... | H05K 13/0061 |
| | | | | 29/564.1 |
| 8,613,134 B2 * | 12/2013 | Doyle | ............. | H05K 13/0061 |
| | | | | 198/463.3 |
| 2003/0066734 A1 * | 4/2003 | Prentice | ............. | B65G 21/10 |
| | | | | 198/346.1 |
| 2008/0159833 A1 * | 7/2008 | Lee | ............... | H05K 13/0061 |
| | | | | 414/217.1 |
| 2010/0126363 A1 * | 5/2010 | Mizuno | ............. | H05K 3/1216 |
| | | | | 101/126 |
| 2010/0229378 A1 | 9/2010 | Uchino et al. | | |
| 2011/0197775 A1 * | 8/2011 | Nagao | ............. | H05K 13/0452 |
| | | | | 101/126 |
| 2013/0333206 A1 * | 12/2013 | Doyle | ............. | H05K 13/0061 |
| | | | | 29/729 |

FOREIGN PATENT DOCUMENTS

| | | |
|---|---|---|
| JP | 2002-26599 A | 1/2002 |
| JP | 2007-258319 A | 10/2007 |
| JP | 2009-124031 A | 6/2009 |

OTHER PUBLICATIONS

International Search Report dated Nov. 11, 2014 in PCT/JP2014/070700 filed Aug. 6, 2014.

* cited by examiner

SURFACE MOUNT DEVICE FOR CONTROL OF HOLDING AND MOVING PRINTED CIRCUIT BOARD IN THE PRIORITY ORDER

TECHNICAL FIELD

The present application relates to a board work device.

BACKGROUND ART

Conventional board work devices such as mounting devices that mount components on a circuit board are well-known. Also known are mounting devices provided with two lanes that convey boards. For example, in the mounting device disclosed in patent literature 1, when mounting components on two boards held in a first lane and a second lane, component mounting operation is performed first on the board that is loaded first. With this device, if a state arises in which component mounting operation on the latter board becomes possible before component mounting operation on the initial board has finished, a component that is a target for component mounting operation to the initial board becomes a mounting start component for the latter board at this point. By doing this, with this device, the frequency of work required when changing component types is decreased. Note that, with this device, it is determined whether component mounting operation is possible on the latter board by using the board detection signal of a board sensor that detects whether the board has been positioned correctly at the mounting position.

CITATION LIST

Patent Literature

Patent Literature 1: JP-A-2007-258319

SUMMARY

However, with the mounting device disclosed in patent literature 1, the determination of whether component operation on the latter board is possible is based only on whether the latter board is positioned correctly. For example, there are cases in which priority orders should be maintained within multiple work operations of mounting components on the latter board, and these cases are not considered.

The present disclosure takes account of the above circumstances, and an object thereof is to perform board work with good efficiency while maintaining a priority order.

The present disclosure using the following means to achieve the above object.

The present disclosure of a board work device includes: a housing means that includes multiple housing sections that are capable of housing multiple types of board work means that perform board work on a board; a holding means configured to exchangeably hold the board work means; a moving means configured to move the holding means; a first lane and a second lane in which the board is conveyed; a corresponding relationship acquisition means configured to acquire a corresponding relationship between the types of board work means and each of the multiple board works for each of the boards; a priority order acquisition means configured to acquire a priority order between at least two of the board works from the multiple board works within the same board; and a control means configured to control the holding means and the moving means such that, when performing the board work based on the acquired corresponding relationship, in a case in which there is no board work capable of being performed on the board being conveyed in one of the first lane and the second lane using the board work means currently being held by the holding means while maintaining the priority order, and there is board work capable of being performed on the board being conveyed in the other one of the first lane and the second lane using the board work means currently being held by the holding means while maintaining the priority order, the board work that is capable of being performed in the other lane is performed without exchanging the board work means currently being held.

The present disclosure of a board work device acquires the corresponding relationship between each of the multiple board works for each board and the type of board work means, and the priority order between at least two board works from the multiple board works within the same board. Also, when performing board work based on the acquired corresponding relationship, in a case in which there is no board work capable of being performed on the board being conveyed in one of the first lane and the second lane using the board work means currently being held by the holding means while maintaining the priority order, and there is board work capable of being performed on the board being conveyed in the other one of the first lane and the second lane using the board work means currently being held by the holding means while maintaining the priority order, the holding means and the moving means are controlled such that board work capable of being performed is performed in the other lane without exchanging the board work means currently being held. Accordingly, it is possible to perform the board works of both the one lane and the other lane without exchanging the board work means currently being held and while maintaining the priority order between multiple board works, and it is possible to reduce the quantity of exchanges of the board work means. Thus, it is possible to perform board work efficiently while maintaining the priority order.

With the board work device of the present disclosure, the holding means may be a head holding body configured to exchangeably hold multiple types of heads as the board work means, the heads including at least one of a mounting head configured to hold components and a dispensing head configured to dispense a viscous fluid on the board. Accordingly, it is possible to perform board work efficiently with a small quantity of head exchanges while maintaining the priority order.

With the board work device of the present disclosure, the holding means may be a head configured to exchangeably hold multiple types of nozzles as the board work means, the nozzles being one of a suction nozzle configured to pick up a component or a dispensing nozzle configured to dispense viscous fluid on the board. Accordingly, it is possible to perform board work efficiently with a small quantity of nozzle exchanges while maintaining the priority order.

With the board work device of the present disclosure, the control means, in a case in which there is no board work capable of being performed on the board being conveyed in one of the lanes using the board work means currently being held while maintaining the priority order and no board is being conveyed in the other lane, may be configured not to exchange the board work means currently being held until the board is conveyed in the other lane, if the time until the board is conveyed in the other lane is less than a specified threshold value.

Accordingly, because there are cases in which board work may be performed at the other lane using the board work means currently being held by waiting until a board is conveyed in the other lane, the quantity of exchanges of the board work means is reduced. In this case, the board work device of the present disclosure may be further provided with a conveyance information acquisition means configured to acquire conveyance information related to conveyance of the board in the other lane, and the control means may determine whether the time until a board is conveyed in the other lane is less than the specified threshold value based on the conveyance information.

The board work device of the present disclosure may further include a conveyance information acquisition means configured to acquire conveyance information related to conveyance of the board in the other lane, the conveyance information acquisition means, in a case in which there is no board work capable of being performed on the board being conveyed in one of the lanes using the board work means currently being held while maintaining the priority order and no board is being conveyed in the other lane, being configured to determine whether to exchange the board work means currently being held without waiting for the board to be conveyed in the other lane, based on the conveyance information. Accordingly, based on the conveyance information, it is possible to appropriately determine whether to reduce the waiting time by exchanging the board work means without waiting until a board is conveyed in the other lane, or to reduce the quantity of exchanges of the board work means by waiting until a board is conveyed in the other lane. Note that, the control means may perform the determination based on whether the conveyance information was acquired or not. Also, the conveyance information acquisition means may acquire the conveyance information from a device upstream in the conveyance direction of the other lane.

With the board work device of the present disclosure, the control means, in a case in which there is no board work capable of being performed on the board being conveyed in one of the lanes using the board work means currently being held while maintaining the priority order and no board is being conveyed in the other lane, may be configured to perform board work on the board conveyed in the one of the lanes after exchanging the board work means currently being held without waiting for the board to be conveyed in the other lane, if there is no board work capable of being performed on the board being conveyed in the other lane using the board work means currently being held by the holding means while maintaining the priority order. Accordingly, unnecessary waiting time is reduced and board work can be performed efficiently.

DESCRIPTION OF EMBODIMENTS

Figure 1:
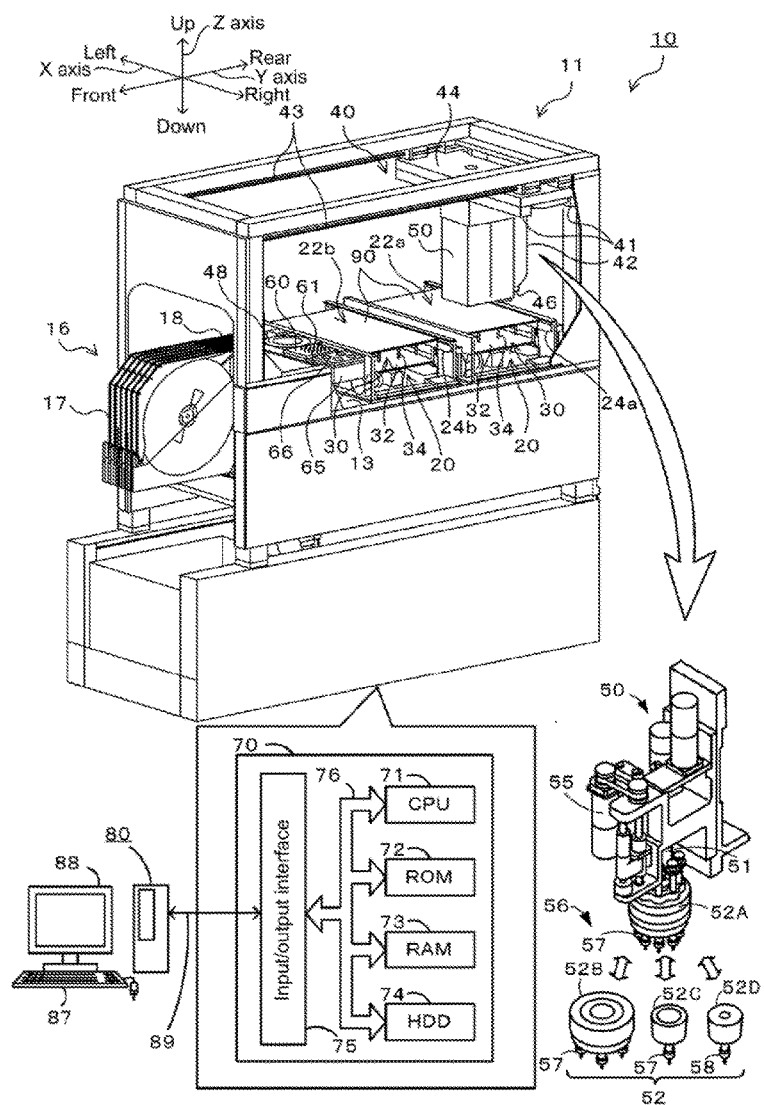
FIG. 1 shows an outline of the configuration of an embodiment, board work system 10.

Hereinafter, an embodiment of the present disclosure will be described with reference to the figures. FIG. 1 shows board work system 10. The embodiment board work system 10 is provided with board work device 11 configured to perform board work such as component mounting processing or adhesive dispensing processing on board 90, and mounting management computer 80 configured to specify settings and manage information related to the board work. In the present embodiment, left-right directions (X axis), front-rear directions (Y axis), and up-down directions (Z axis) are set as shown in FIG. 1. Mounting processing includes processing such as arranging a component above a board, mounting, insertion, joining, and gluing. Board work system 10 is provided with other board work devices, which are not shown, on the upstream side (left side) and downstream side (right side) of board work device 11 in the conveyance direction, and these multiple board work devices configure a board work line. Also, these multiple board work devices and management computer 80 are connected to each other via LAN 89.

Board work device 11 is provided with component supply device 16 that indexes components from reel 17, conveyance section 20 that conveys board 90, backup device 30 that backs up board 90 conveyed by conveyance section 20 from the underside of board 90, moving section 40 that moves head holding body 51 of work section 50, work section 50 that performs various board works, and control device 70 that performs overall control of board work device 70. Also, board work device 11 is provided with mark camera 46 capable of imaging reference marks provided on board 90, component camera 48 capable of imaging a component held by work section 50, nozzle stocker 60 for stocking multiple nozzles 56, and head stocker 65 for stocking multiple heads 52.

Component supply device 16 is provided with multiple reels 17 on which are wound tape that stores components, and is removably attached to the front side of board work device 11. The tape is indexed by feeder section 18 to be unwound from reel 17 such that a component is positioned at a pickup position at which the component is picked up by work section 50. Multiple feeder sections 18 are provided to correspond to the quantity of reels 17, and are removably arranged on board work device 11.

Conveyance section 20 is configured as a dual-lane type conveyance device provided with two board conveyance paths, first lane 22a and second lane 22b, and is arranged on support base 13 provided in a center section of the main body of board work device 11. Belt conveyor devices 24a and 24b are arranged at each lane. Boards 90 are each conveyed on the first and second lanes 22a and 22b from the left to right of FIG. 1 (conveyance direction) by the driving of belt conveyor devices 24a and 24b.

Backup devices 30 are arranged to correspond to each of first lane 22a and second lane 22b. Backup device 30 is provided with backup plate 32 arranged so as to be raisable and lowerable by a raising and lowering device that is not shown, and multiple backup pins 34 established on backup plate 32. Backup device 30 backs up board 90 from the underside (lower side) by raising backup plate 32 with board 90 conveyed to a position above backup plate 32 by conveyance section 20.

Moving device 40 is provided with X-axis guide rail 41, X-axis slider 42, Y-axis guide rail 43, and Y-axis slider 44. X-axis slider 42 is attached to the lower surface of Y-axis slider 44, which is slidable in the front/rear direction, so as to be slidable in the left/right direction. Y-axis slider 44 is slidably attached to a pair of guide rails 43 and 43 that extend in the front/rear direction. Note that, Y-axis guide rails 43 and 43 may be fixed to the inside of board work device 11. Pair of X-axis guide rails 41 and 41 that extend in the left/right direction are provided on the lower surface Y-axis slider 44, and X-axis slider 42 is attached to these X-axis guide rails 41 and 41 so as to be slidable in the left/right direction. Work section 50 moves in the left and right directions based on the moving in the left and right directions of X-axis slider 42, and moves in the front and rear directions based on the moving in the front and rear directions of Y-axis slider 44. Note that, each slider 42 and 44 is driven by a drive motor, which are not shown.

Work section 50 is provide with nozzle 56, head 52 that exchangeably holds at least one nozzle 56, head holding body 51 that exchangeably holds head 52, and Z-axis motor 55 that raises and lowers nozzle 56 being held on head 52 in the Z-axis direction (vertical direction). Head holding body 51, for example, may be four types of attachable and removable heads, first to fourth heads 52A to 52D. Note that, first to fourth heads 52A to 52D are referred to generically as head 52. Also, head holding body 51 is able to rotate and raise and lower in the Z-axis direction due to drive motors, which are not shown. Nozzle 56 includes pickup nozzle 57 that picks up a component, and dispensing nozzle 58 that dispenses an adhesive fluid such as adhesive.

First to third heads 52A to 52C are configured from mounting heads that hold a component. First head 52A is provided with twelve nozzle holders, such that twelve suction nozzles 57 can be mounted. Second head 52B is provided with four nozzle holders, such that four suction nozzles 57 can be mounted. Third head 5CB is provided with one nozzle holder, such that one suction nozzle 57 can be mounted. Suction nozzles 57 mounted on (held by) first to third heads 52A to 52C use air pressure pressure to pick up and release a component at the nozzle tip. Suction nozzle 57 is raised and lowered in the Z-axis direction by holder raising and lowering driven by Z-axis motor 55.

Fourth head 52D is provided with an internal housing chamber that houses adhesive, and is configured as a dispensing head that dispenses adhesive on board 90. Fourth head 52D is provided with one nozzle holder, and one dispensing nozzle 58 is removably attached. Dispensing nozzle 58 mounted on (held by) fourth head 52D dispenses adhesive used for attaching a component to board 90 from a dispensing outlet at the nozzle tip using pressure.

Mark camera 46 images board 90 from above and is arranged below X-axis slider 42. The imaging region of mark camera 46 is below mark camera 46, and mark camera 46 reads reference marks provided on board 90 that represent a reference position of board 90, a reference position for arranging components, or the like. Mark camera 46 moves in the X and Y directions according to the movement of work section 50.

Component camera 48 is arranged in front of second lane 22b. The imaging range of component camera 48 is above component camera 48. When work section 50 passes above component camera 48, component camera 48 is able to capture an image of head 52 held on head holding body 51, nozzle 56 held on head 52, or a component held on nozzle 57, or the like. Component camera 48 outputs the captured image to control device 70.

Nozzle stocker 60 is a box with multiple nozzle housing sections 61 that are capable of housing a nozzle 56. Nozzle housing sections 61 are each capable of housing one of multiple types of suction nozzle 57 appropriate for a given type of component to be picked up, or one of multiple types of dispensing nozzle 58 appropriate for a given amount of adhesive to be dispensed.

Head stocker 65 is a box with multiple (in the present embodiment, four) head housing sections 66 capable of housing a head 52. Head housing sections 66 are each capable of housing one of first to fourth heads 52A to 52D.

Control device 70 is configured from a microprocessor based around CPU 71, ROM 72 that memorizes a processing program, RAM 73 used as working memory, HDD 74 that memorizes various data, input/output interface 75 for performing communication of electric signals with external devices, and so on, and these are connected by bus 76. Control device 70 is connected to component supply device 16, conveyance section 20, backup device 30, moving section 40, mark camera 46, component camera 48, work section 50, and the like, such that two-way communication is possible. Control device 70 outputs a control signal to conveyance section 20, backup device 30, moving section 40, and work section 50 and so on, and receives an input of image signals from mark camera 46 and component camera 48. Note that, position sensors, not shown, are provided on each slider 42 and 44 of moving section 40, and control device 70 controls drive motors of each slides 42 and 44 while receiving an input of position information from those position sensors. Also, control device 70 is connected to management computer 80 via LAN 89 such that two-way communication is possible, and communication of data and control signals is performed between these items.

Figure 2:
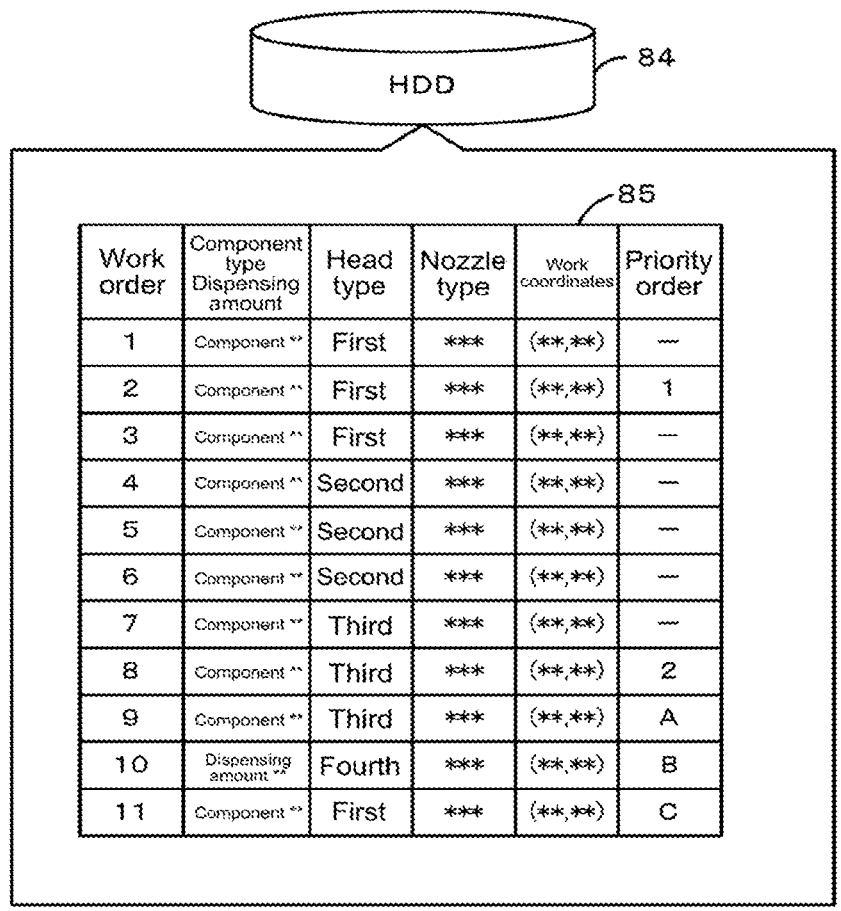
FIG. 2 illustrates work information 85 stored on HDD 84 of management computer 80.

Management computer 80 is a PC that manages information related to board work, and is provided with input device 87 such as a mouse and keyboard, display device 88, and so on. As shown in FIG. 2, HDD 84 of management computer 80 memorizes production job data that includes work information 85.

As shown in FIG. 2, included in work information 85 is information corresponding to a work order of board work performed on board 90, a dispensing amount of adhesive to be dispensed or a type of a component to be mounted on board 90, a type of head 52 used for the board work, a type of nozzle 56 used for the board work, work coordinates representing a position on board 90 at which the board work is to be performed, a priority order between at least two board works, and the like. Note that, in the present embodiment, two types are included in the priority order, a first priority order defined by sequential numbers (1, 2, . . . ), and a second priority order defined by sequential letters (A, B, C, . . . ). Also, the first priority order is specified such that tall components are mounted after short components, based on the heights of components. This first priority order is specified to mitigate problems that occur due to tall components obstructing short components if the tall components are mounted first (for example, pre-mounted components may interfere with work section 50 or picked up components). For example, in FIG. 2, the order is defined such that a component corresponding to work order 8 is mounted after a component corresponding to work order 2 has been mounted. The second priority order relates to dispensing adhesive onto a component, or mounting a component onto another component. For example, in FIG. 2, board work of work orders 9 to 11 is specified to be performed while maintaining the second priority order. Board work of work order 9 is work to mount a component on board 90. Board work of work order 10 is work of dispensing adhesive on the upper surface of the component mounted in work order 9. Board work of work order 11 is work of mounting a component on the component mounted in work order 9 and fixing the component using the adhesive dispensed in work order 10. Note that, in FIG. 2, a "-" in the priority order column indicates that there is no priority order to be maintained for the corresponding board work. Also, this kind of work information 85 is defined, for example, according to each type of board 90. Also, production job data, in addition to work information 85, includes information such as how many boards 90 are to be produced, position information of reference marks on board 90, and so on.

Figure 3:
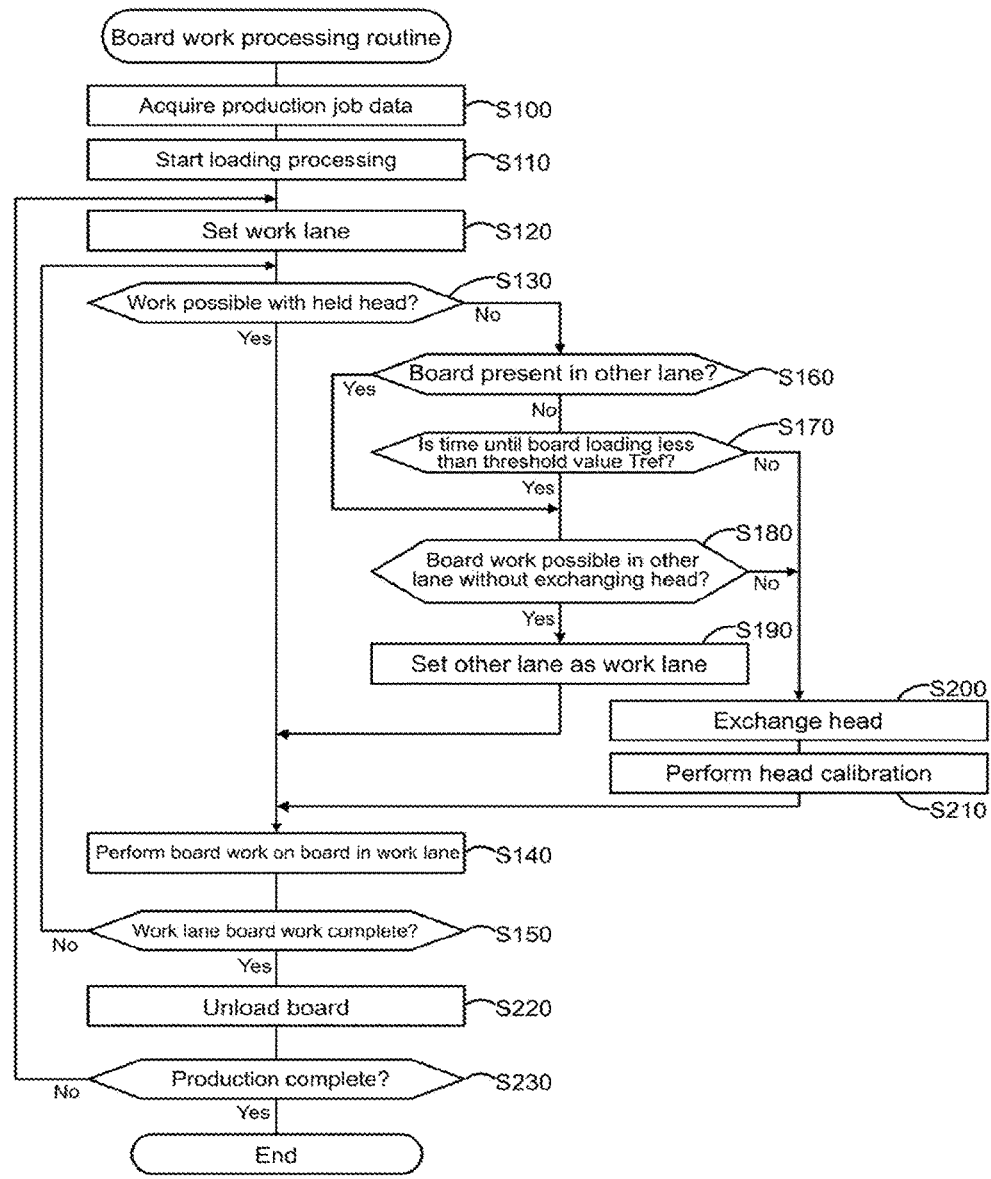
FIG. 3 is a flowchart showing an example of a board work processing routine.

Next, operation of embodiment board work system 10 configured as above is described. FIG. 3 is a flowchart showing an example board work processing routine run by CPU 71 of control device 70. This routine is memorized on HDD 74 of control device 70, and is run when a command signal is received from management device 80, or the like.

When the routine is run, CPU 71 of control device 70 first acquires production job information including work information 85 from management computer 80 and memorizes it on HDD 74 (step S100). Note that, CPU 71 may memorize production job data by receiving it in advance from management computer 80 and memorizing it on HDD 74.

Continuing, CPU 71 starts loading processing of consecutively loading boards 90 (step S110). In this loading processing, CPU 71 first waits until a board 90 has been conveyed in each lane from another board work device from the upstream side of board work device 11. Note that, on each of first and second lanes 22a and 22b, board detection sensors, not shown, are arranged near the upstream edge of the lane for example, and CPU 71 determines whether a board 90 has been conveyed to each lane, based on the signals from the board detection sensors. If it is determined that a board 90 is conveyed to at least one of first lane 22a or second lane 22b, conveyance section 20 of the lane in which board 90 was detected is controlled such that board 90 is conveyed by belt conveyor device 24a and 24b. Then, CPU 71 controls backup device 30 such that the board 90 is fixed in a specified work position at which board work is performed. When the board 90 is unloaded after the board work at the lane at which the board 90 was fixed is complete, CPU 71 waits again until the next board 90 is conveyed to a lane based on a signal from the board detection sensor.

After loading processing starts, CPU 71 sets the work lane that will be the work target (step S120). In this processing, CPU 71 investigates whether a board 90 is fixed at the work position at first lane 22a or second lane 22b. When a board 90 is fixed at the work position at either of first lane 22a or second lane 22b, that lane is set as the work lane. If a board 90 is fixed at the work position at both first lane 22a and second lane 22b, one of the lanes is set as the work lane. For example, CPU 71 may set the lane of a board 90 for which more board work specified by work information 85 has been completed as the work lane. CPU 71 may also always set the first lane as the work lane when a board 90 is fixed at the work position at both first lane 22a and second lane 22b.

Continuing, CPU 71 determines whether there is board work capable of being performed using head 52 currently being held by head holding body 51 on board 90 of the work lane while maintaining the priority order, based on the acquired work information 85 (step S130). Note that, as necessary (for example, before performing the first board work on a fixed board 90) CPU 71 moves mark camera 46 and causes mark camera 46 to image information representing the type of board 90 such as a 2D code affixed to the board 90. Then, CPU 71 determines the type of the board 90 based on the captured image and identifies the corresponding work information 85. Also, when head holding body 51 is not holding a head 52, CPU 71 identifies the board work with the lowest work priority number that is capable of being performed while maintaining the priority order, from the yet-to-be-performed board work included in the work information 85 corresponding to the work lane board 90. Then, CPU 71 determines the type of head 52 required to perform the identified board work based on the work information 85, and causes the determined type of head 52 to be held by head holding body 51. When there is board work capable of being performed in the work lane in step S130, CPU 71 performs the board work using head 52 currently being held on the board 90 while maintaining the priority order (step S140). Here, CPU 71 performs the board work by appropriately changing the work order defined in the work information 85, while maintaining the priority order defined in the work information 85.

For example, when first head 52A is held by head holding body 51, CPU 71 first identifies board work capable of being performed by first head 52A while maintaining the priority order, based on the work information 85. Next, CPU 71 exchanges suction nozzle 57 of first head 52A appropriately based on the work information 85. When suction nozzle 57 is exchanged, CPU 71 moves first head 52A above component camera 48 and causes component camera 48 to capture an image, and then determines whether there is an error with the suction nozzle 57 (the type or holding state of the suction nozzle 57 held by first head 52A) based on the image. If there is an error with the suction nozzle 57, CPU 71, for example, performs exchange of suction nozzle 57 or notifies an operator of the error. If there is no error with suction nozzle 57 or suction nozzle 57 has not been exchanged, CPU 71 picks up and holds as many components specified by the identified board work as is possible with the suction nozzles 57 of first head 52A (for first head 52A, up to twelve). Next, CPU 71 moves first head 52A above component camera 48 and causes component camera 48 to capture an image, and then determines whether there is an error with the holding state of the components held by suction nozzles 57 (errors such as a component error, an orientation error such as component tilt, or holding position deviation) based on the image. Then, CPU 71 controls moving section 40 and work section 50 to arrange (mount) in sequence components without errors on board 90 at the specified work coordinates. Also, CPU 71 disposes of components with errors. Also, as necessary (for example, before performing the first board work on a board 90), CPU 71 images a reference mark of board 90 with mark camera 46 and performs processing to detect the coordinates of the reference mark. Board work is performed in a similar manner for second to third heads 52B to 52C, except that a different quantity of components can be held.

Also, when fourth head 52D is held by head holding body 51, CPU 71 first identifies board work capable of being performed by first head 52D while maintaining the priority order, based on the work information 85. Next, CPU 71 exchanges dispensing nozzle 58 of fourth head 52D appropriately based on the work information 85. When dispensing nozzle 58 is exchanged, CPU 71 moves fourth head 52D above component camera 48 and causes component camera 48 to capture an image, and then determines whether there is an error with the dispensing nozzle 58 (the type or holding state of the dispensing nozzle 58 held by fourth head 52D) based on the image. If there is an error with the dispensing nozzle 58, CPU 71, for example, performs exchange of dispensing nozzle 58 or notifies an operator of the error. If there is no error with dispensing nozzle 58 or dispensing nozzle 58 has not been exchanged, CPU 71 controls conveyance section 20 and work section 50 such that a specified amount of adhesive is dispensed on board 90 at the specified work coordinates.

When board work is performed in step S140 as above, CPU 71 determines whether all the board work for the work lane board 90 has been completed based on the work information 85 (step S150). If not all the board work of the work lane board 90 has been completed, CPU 71 performs processing from step S130. That is, CPU 71 repeats processing of steps S130 to S150 until there is no board work capable of being performed on the work lane board 90 using head 52 currently being held by head holding body 51 while maintaining the priority order, or all the board work on the work lane board 90 has been performed.

On the other hand, when there is no board work capable of being performed on the work lane board 90 using head 52 currently being held by head holding body 51 while maintaining the priority order in step S130, CPU 71 determines whether a board 90 has been conveyed in the other lane, which is not the work lane, and fixed at the work position (step S160). Then, when there is no board 90 fixed at the work position in the other lane, CPU 71 determines whether the waiting time for the next board 90 to be conveyed and fixed at the work position in the other lane is less than specified threshold value Tref (step S170). In this processing, CPU 71 checks whether conveyance information has been received from a board work device upstream of board work device 11, and determines that the waiting time is less than specified threshold value Tref when conveyance information has been received. Here, with board work system 10 of the present embodiment, provided as another board work device adjacent to board work device 11 on the upstream side is a printer device that applies adhesive onto board 90 by screen printing. Then, when the printer device unloads the board 90 after screen printing onto the board 90 is complete, the conveyance information is sent via LAN 89 to the downstream board work device 11. In step S170, CPU 71 determines whether the conveyance information has been received. Note that, threshold value Tref is determined based on experience, and is a value such that, when comparing a case in which exchange of head 52 is performed without waiting for a board 90 to be conveyed to the other lane, and a case in which board work is performed using head 52 currently being held at the other lane without exchanging head 52 until a board 90 is conveyed in the other lane without exchanging head 52, the latter effectively makes the overall work time to be shorter. Also, tests or the like are performed in advanced to confirm that the time from when the conveyance information is sent to board work device 11 to the time a board 90 actually being conveyed is fixed at the work position in board work device 11 does not exceed threshold value Tref.

When there is a board 90 in the other lane and it has been fixed at the work position in step S160, or when the waiting time is less than threshold value Tref in step S170, CPU 71 determines whether there is board work capable of being performed on the board 90 in the other lane without exchanging head 52 and while maintaining the priority order, based on the acquired work information 85 (step S180). That is, CPU 71 determines whether there is board work capable of being performed on board 90 of the other lane using head 52 currently being held by head holding body 51 while maintaining the priority order. Here, CPU 71, in a similar manner to the above step S130, determines the type of board 90 based on the image acquired using mark camera 46, and thus identifies the corresponding work information 85. Note that, CPU 71 may acquire information related to the type of board 90 to be conveyed next from management computer 80 in order to determine the type of board 90. In particular, when board 90 has still not been conveyed from the adjacent printer device, it is desirable that CPU 71 acquires information from management computer 80 to determine the type of board 90.

Also, when there is board work capable of being performed on the board 90 of the other lane without exchanging head 52 and while maintaining the priority order in step S180, CPU 71 sets the work lane as the other lane (step S190) and performs processing from step S140. For example, when the work lane is first lane 22a, CPU 71 sets second lane 22b as the work lane. Accordingly, CPU 71 repeats processing of steps S130 to S150 until, with respect to the newly set work lane, there is no board work capable of being performed on the board 90 using head 52 currently being held by head holding body 51 while maintaining the priority order, or all the board work of the work lane board 90 has been performed. Note that, when a board 90 has not yet been fixed at the work position in step S190, CPU 71 performs processing from step S140 after waiting until the board 90 is fixed.

Conversely, if conveyance information has not been received in step S170, or if there is no board work capable of being performed on board 90 of the other lane without exchanging heads 52 and while maintaining the priority order in step S180, CPU 71 should perform board work capable of being performed on the work lane board 90 while maintaining the priority order, and so exchanges head 52 held by head holding body 51 (step S200). In this processing, CPU 71 moves work section 50 and houses head 52 held by head holding body 51 in head housing section 66 of head stocker 65, and mounts exchange target head 52 housed in head housing section 66 on head holding body 51. Note that, CPU 71 determines which head 52 to exchange, for example, as below. First, CPU 71 identifies the board work with the lowest work priority number that is capable of being performed while maintaining the priority order, from the yet-to-be-performed board work included in the work information 85 corresponding to the work lane board 90. Then, CPU 71 determines the type of head 52 required to perform the identified board work based on the work information 85, and identifies the determined type of head 52 as the exchange target.

Next, CPU 71 performs calibration (correction) related to head 52 held by head holding body 51 (step S210). Processing from step S140 is performed. By this, CPU 71 repeats processing of steps S130 to S150 until there is no board work capable of being performed using the post-exchange head 52 while maintaining the priority order, or all the board work on the work lane board 90 has been performed. Note that, calibration is processing for adjusting positioning during work operations of head 52 to account for attachment tolerances of head 52 and the like. For example, CPU 71 images head 52 using component camera 48, measures the position of head 52 held by head holding body 51, measures the rotational center of head 52 as it rotates (rotates about its own center), and so on.

Then, when all board work on the work lane board 90 has been completed in step S150, CPU 71 controls backup device 30 and conveyance section 20 to unload board 90 towards a downstream board work device (step S220), and determines whether production is complete based on the quantity of boards for which work is complete (step S230). If production is not complete, CPU 71 performs processing from step S120. Conversely, if production is complete, CPU 71 ends the routine.

Figure 4:
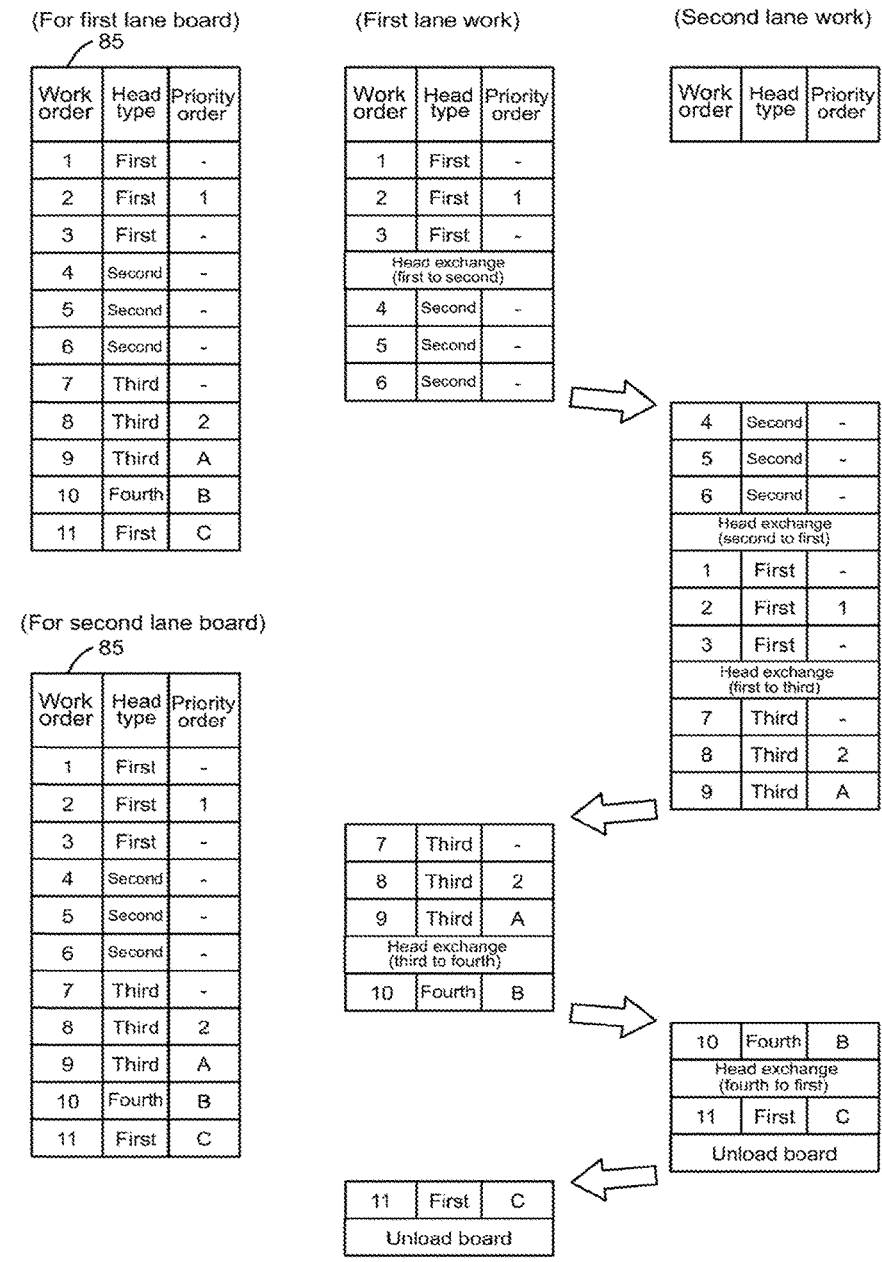
FIG. 4 shows states of the board work processing.

The states when the above board work processing routine is performed are described next with reference to FIG. 4. FIG. 4 shows states of the board work processing. Work information 85 for board 90 of first lane 22a, and work information 85 for board 90 of second lane 22b are shown on the left of FIG. 4. Note that, here boards 90 of first and second lanes 22a and 22b are the same type of board 90, and work information 85 is also the same. Also, in FIG. 4, of work information 85, only the work order, head type, and priority order are shown. In the central portion of FIG. 4, board work performed at first lane 22a is shown in chronological order from top to bottom. On the right side in FIG. 4, board work performed at second lane 22ba is shown in chronological order from top to bottom.

Descriptions are given based on the chronological order of FIG. 4. First, in the board work processing routine, a board 90 is only conveyed in first line 22a, and first head 52A is held by head holding body 51. In this case, CPU 71, after starting loading processing of step S110, sets the first lane 22a as the work lane in step S120, and then sequentially performs board work of work order 1 to 3 that is capable of being performed by first head 52A in step S140. Then, when board work of work order 3 is complete, in the next step S130, because there is no board work capable of being performed using the currently held first head 52A while maintaining the priority order in the first lane work information 85, CPU 71 performs processing from step S160. Note that, in the work information 85 of the first lane board 90 there is board work using first head 52A at work order 11, but this is designated with order C in the second priority order, and in order to maintain the priority order, order C work must be performed after order A and B work. Thus, CPU 71 determines that there is no board work capable of being performed using first head 52A while maintaining the priority order. Then, in a case in which a board 90 has not been conveyed in the other lane, that is, second lane 22b, and conveyance information has not been received, CPU 71 exchanges head 52 in step S200. Here, because the board work in work information 85 that is capable of being performed while maintaining the priority order with the lowest work order is board work of work order 4, CPU 71 exchanges to the corresponding second head 52B. Then, after performing calibration in step S210, CPU 71 sequentially performs board work of work orders 4 to 6 on board 90 in first lane 22a in step S140.

Then, when board work of work order 6 is complete in first lane 22a, in the next step S130, because there is no board work capable of being performed using the currently held second head 52B while maintaining the priority order in the first lane work information 85, CPU 71 performs processing from step S160. While board work of work orders 4 to 6 is being sequentially performed, when a board 90 is conveyed in second lane 22b and fixed at the work position, and the conveyance information received, CPU 71 performs processing of step S180. Here, within the work information 85 of the board 90 of the second lane, there is board work (work orders 4 to 6) capable of being performed using the currently held second head 52B while maintaining the priority order. Thus, CPU 71 sets second lane 22b as the work lane in step S190 and sequentially performs board work of work orders 4 to 6 on the board 90 in second lane 22b in step S140 without exchanging head 52.

Then, when board work of work order 6 is complete in second lane 22b, in the next step S130, because there is no board work capable of being performed using the currently held second head 52B while maintaining the priority order in the second lane work information 85, CPU 71 performs processing from step S160. Then, in step S180, because there is no board work capable of being performed using the currently held second head 52B while maintaining the priority order in the work information 85 of the board 90 in the other lane, which is first lane 22a (work orders 1 to 6 have been completed), CPU 71 exchanges the head 52 to first head 52A in step S200, and after performing calibration, performs board work of work orders 1, 2, and 3 on the board 90 in second lane 22b. In this manner, CPU 71 sequentially performs board work capable of being performed using the currently held head 52 while maintaining the priority order for the first and second lanes 22a and 22b.

After this, as shown in FIG. 4, if there is board work capable of being performed using the currently held head 52 while maintaining the priority order, work is performed changing work lanes as appropriate; if there is no board work capable of being performed using the currently held head 52, work is performed after changing head 52. Then, as shown in FIG. 4, when all the board work for boards 90 is complete having completed board work of work order 11 on the board 90 of second lane 22b, CPU 71 unloads the board 90 of second lane 22b in step S220. Also, for the board 90 of first lane 22a, when all the board work for the board 90 is complete having completed board work of work order 11, the board 90 is unloaded. By performing board work as described above, work is performed by changing work lanes while board work to the boards 90 in each lane is performed maintaining the priority order. Also, in the example of FIG. 4, exchange of heads 52 is performed a total of five times. In contrast to this, for example, if board work was performed on the board 90 in second lane 22b after completing all the board work on the board 90 in first lane 22a, because exchange of heads 52 would have been performed four times in each lane, exchange of heads 52 would have been performed a total of eight times. Thus, by performing work by changing work lanes without exchanging heads 52, the quantity of exchanges of heads 52 and the quantity of calibration work of step S210 performed after heads 52 are exchanged is reduced. Note that, with FIG. 4 descriptions were given with the boards 90 of the first and second lanes 22a and 22b being the same type of board 90, and the work information 85 also being the same; however, the configuration is not limited to this, and the types of board 90 and contents of board work (work information 85) may differ between first lane 22a and second lane 22b. In this case, too, the quantity of exchanges of heads 52 and the quantity of calibration work is reduced.

Correspondences between constituent elements of the present embodiment and constituent elements of the disclosure will be clarified here. In the present embodiment, head 52 corresponds to the board work means of the present disclosure, head stocker 65 corresponds to the housing means, head holding body 51 corresponds to the holding means; moving section 40 corresponds to the moving means; first lane 22a corresponds to a first lane, second lane 22b corresponds to a second lane; and CPU 71 corresponds to the corresponding relationship acquisition means, the priority order acquisition means, and the control means. Also, CPU 71 corresponds to the conveyance information acquisition means.

According to board work system 10 described above, CPU 71 acquires work information 85 that includes the corresponding relationship between each of the multiple board works for each board 90 and the type of head 52, and the priority order between at least two board works from the multiple board works within the same board 90. Then, when performing board work based on the acquired corresponding relationship, in a case in which there is no board work capable of being performed on the board 90 being conveyed in one lane (the work lane) of first lane 22a and second lane 22b using the head 52 currently being held by head holding body 51 while maintaining the priority order, and there is board work capable of being performed on the board 90 being conveyed in the other lane using the head 52 currently being held while maintaining the priority order, head holding body 51 and moving section 40 are controlled such that board work capable of being performed is performed in the other lane without exchanging head 52 currently being held. Accordingly, it is possible to perform the board works of both first lane 22a and second lane 22b without exchanging the head 52 currently being held and while maintaining the priority order between multiple board works, and it is possible to reduce the quantity of exchanges of the board work means. Thus, it is possible to perform board work efficiently while maintaining the priority order.

Also, with board work device 11, head holding body 51 exchangeably holds multiple types of heads as the board work means, the heads including a mounting head (first to third heads 52A to 52C) configured to hold components and a dispensing head (fourth head 52D) configured to dispense adhesive on the board. Accordingly, it is possible to perform board work efficiently with a small quantity of head 52 exchanges while maintaining the priority order.

Further, CPU 71, in a case in which there is no work capable of being performed on the board 90 being conveyed in the work lane using the currently held head 52 and no board 90 is being conveyed in the other lane, does not exchange the currently held head 52 until a board 90 is conveyed in the other lane, if the time until the board 90 is conveyed in the other lane is less than specified threshold value Tref. Accordingly, because there are cases in which board work may be performed at the other lane using the currently held head 52 by waiting until a board 90 is conveyed in the other lane, the quantity of exchanges of head 52 is reduced.

Further, CPU 71 acquires conveyance information related to the conveyance of the board 90 to the other lane from an upstream board work device that conveys to the other lane. Also, CPU 71 determines whether the time until a board 90 is conveyed in the other lane is less than threshold value Tref based on the conveyance information. Thus, it is possible to perform determination related to the time until a board 90 is conveyed in the other lane more appropriately.

Also, CPU 71, in a case in which there is no work capable of being performed on the board 90 being conveyed in the one lane using the currently held head 52 and no board 90 is being conveyed in the other lane, determines whether to exchange the currently held head 52 without waiting for a board 90 to be conveyed in the other lane based on whether the conveyance information has been acquired. Accordingly, based on the conveyance information, it is possible to appropriately determine whether to reduce the waiting time by exchanging head 52 without waiting until a board 90 is conveyed in the other lane, or to reduce the quantity of exchanges of head 52 by waiting until a board 90 is conveyed in the other lane.

Also, CPU 71, in a case in which there is no work capable of being performed on the board 90 being conveyed in the work lane using the currently held head 52 and no board 90 is being conveyed in the other lane, performs board work on the board 90 conveyed in the other lane after exchanging the head 52 currently being held without waiting for a board 90 to be conveyed in the other lane, if there is no board work capable of being performed on the board 90 being conveyed in the other lane using the head 52 currently being held while maintaining the priority order. Accordingly, unnecessary waiting time is reduced and board work can be performed efficiently.

Meanwhile, it goes without saying that the disclosure is not limited to the above-mentioned embodiment and various embodiments may be applied within the technical scope of the disclosure.

Figure 5:
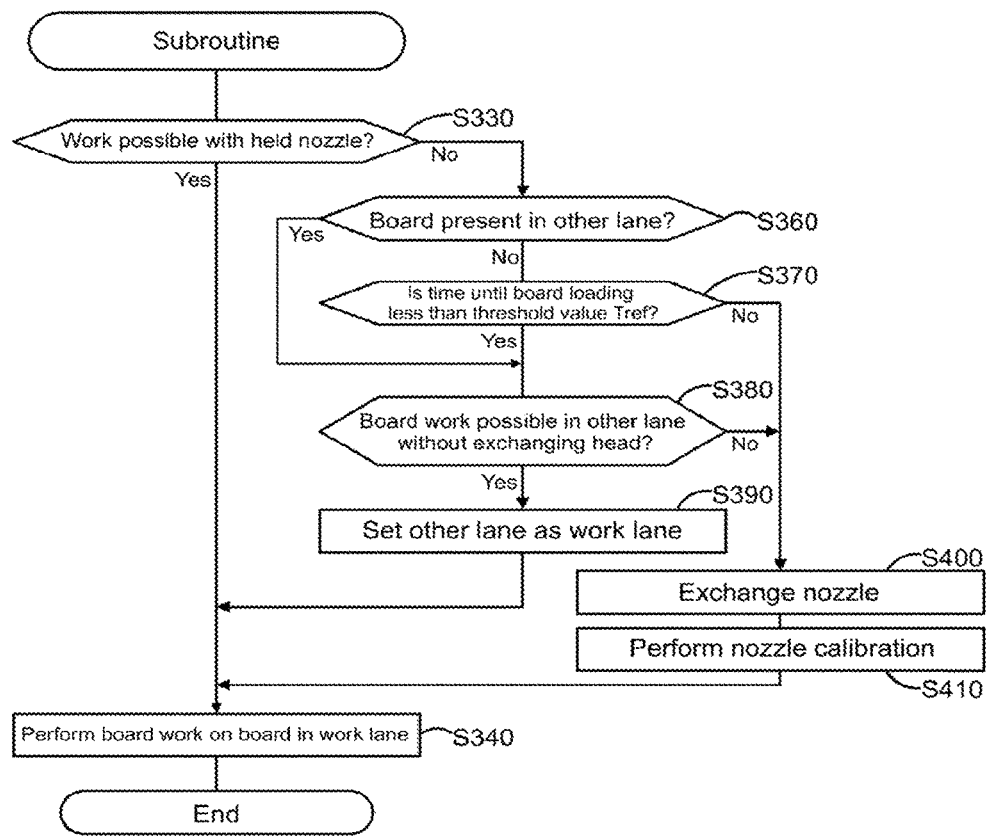
FIG. 5 is a flowchart showing an example of a subroutine.

For example, in the above embodiment, CPU 71 is configured to reduce the number of exchanges of head 52 while maintaining the priority order, but embodiments are not limited to this. CPU 71 may simply reduce the exchange quantity of any board work means exchangeably held by the holding means. For example, in a similar manner to the above embodiment, CPU 71 may reduce the exchange quantity of nozzles 56 exchangeably held by head 52. In this case, CPU 71 may perform the subroutine shown in FIG. 5 in step S140. Because for this subroutine, except for the fact that in steps S330, S380, S400, and S410 processing is for nozzle 56 instead of head 52, processing is similar to that is steps S130 to 140 and S160 to S210 of the above-described board work processing routine, detailed descriptions are omitted.

In the above embodiment, CPU 71 receives conveyance information from another board work device upstream from board work device 11, but the configuration is not limited to this. For example, conveyance information may be acquired from management computer 80.

In the above embodiment, CPU 71 performs determination in step S170 based on whether conveyance information has been received. For example, conveyance information indicating the waiting time until the next board 90 is conveyed may be acquired from an upstream board work device or management computer 80, and it may be determined whether the waiting time is less than threshold value Tref based on the acquired conveyance information. Also, in step S170, CPU 71 determines that the waiting time is less than specified threshold value Tref when conveyance information has been received from a board work device upstream of board work device 11, but the configuration is not limited to this. For example, in step S170, CPU 71 may simply determine whether conveyance information has been received from a board work device upstream of board work device 11, and continue to processing of step S180 if conveyance information has been received, and continue to step S200 if conveyance information has not been received.

In the above embodiment, suction nozzle 57 held by head 52 picks up and holds a component by suction, but the configuration is not limited to this, so long as the component is able to be held. For example, head 52 may hold a mechanical chuck or the like that holds a component by grasping it.

In the above embodiment, processing of at least one of steps S160 or S170 may be omitted. Also, processing of step S190 may be performed before processing of steps S160 and S170.

In the above embodiment, in step S200, CPU 71 identifies the type of head 52 required to perform the yet-to-be-performed board work with the lowest work priority number that is capable of being performed while maintaining the priority order as an exchange target, but the configuration is not limited to this. For example, if board work of the next work order following board work performed immediately previously is able to be performed while maintaining the priority order, CPU 71 may identify a head type required for performing this board work as an exchange target. For example, in FIG. 4, after performing board work of work orders 4 to 6 of second lane 22b, in step S200, CPU 71 may exchange to third head 52C required for performing the next work order 7. Note that, in this case, in the next step S140, CPU 71 performs board work of work orders 7 and 9. Board work of work order 8 is board work to be performed by third head 52C, but it is designated with order 2 as a first priority order, so it must be performed after order 1 work (work order 2) to maintain the priority order.

In the above embodiment, threshold value Tref is a threshold value related to the waiting time until the next board 90 is conveyed in the other lane and fixed at the work position, but is not limited to this. For example, it may be a threshold value related to the waiting time until a board detection sensor detects that the next board 90 has been conveyed in the other lane.

In the above embodiment, board work device 11 performs processing for mounting components and processing for dispensing adhesive on a board 90 as board work, but board work is not limited to this. For example, board work device 11 may perform only one of mounting processing or dispensing processing. Also, board work is not limited to mounting processing or dispensing processing, any kind of board work may be performed on board 90. The board work means and holding means provided on board work device 11 are also not limited to head 52 or head holding body 51, any means appropriate for board work may be used.

In the above embodiment, fourth head 52D is a dispensing head that dispenses adhesive, but any item that dispenses a viscous fluid such as solder or brazing material may be used. This similarly applies to dispensing nozzle 58.

In the above embodiment, work information includes a first priority order related to the height of components as a priority order, and a second priority order related to dispensing adhesive onto a component or mounting another component onto a component, however, work information is not limited to this, so long as the there is a priority order between at least two of the board works from among the multiple board works within the same board 90. For example, cases such as when a cover that covers a component is attached to board 90 after the component is mounted, or a priority order related to only the mounting order of components not related to dispensing adhesive on a component may be included in work information 85. Also, a first priority order (for example, order 1) and a second priority order (for example, order B) may be applied to one board work, or multiple types of priority orders may be applied to one board work.

In the above embodiment, CPU 71, by acquiring work information 85, acquires the corresponding relationship between each of the multiple board works for each board 90 and the type of head 52, and the priority order between at least two board works from the multiple board works within the same board 90, together, but the configuration is not limited to this. For example, CPU 71 may acquire the corresponding relationship and the priority order at different times, or may acquire them from different devices.

INDUSTRIAL APPLICABILITY

The present disclosure may be used in the technical field of board work devices that perform actions such as applying viscous fluids and mounting components on a board.

REFERENCE SIGNS LIST

10: board work system; 11: board work device; 13: support base; 16: component supply device; 17: reel; 18: feeder section; 20: conveyance section; 22a: first lane; 22b: second lane; 24a, 24b: belt conveyor device; 30: backup device; 32: backup plate; 34: backup pin; 40: moving section; 41: X-axis guide rail; 42: X-axis slider; 43: Y-axis guide rail; 44: Y-axis slider; 46: mark camera; 48: component camera; 50: work section; 51: head holding body; 52: head; 52A to 52D: first to fourth heads; 55: Z-axis motor; 56: nozzle; 57: suction nozzle; 58: dispensing nozzle; 60: nozzle stocker; 61: nozzle housing section; 65: head stocker; 66: head housing section; 70: control device; 71: CPU; 72: ROM; 73: RAM; 74: HDD; 75: input/output interface; 76: bus; 80: management computer; 84: HDD; 85: work information; 87: input device; 88: display; 89: LAN; 90: board

The invention claimed is:

1. A board work device comprising:
a conveyance section that conveys boards on which multiple board works are performed, the conveyance section including a first lane and a second lane in which the boards are conveyed;
a work section that performs the board works on the board, the work section including a head holding body that exchangeably holds multiple types of heads, the head holding body only holding one head at a time depending on the board work to be performed;
a moving device which moves the head holding body; and
a controller configured to
acquire a corresponding relationship between the types of heads and each of the multiple board works to be performed for each of the boards;
acquire a priority order between at least two of the board works from the multiple board works within the same board;
set one of the first lane and the second lane as a work lane; and
control the work section and the moving device,
wherein, when performing the board work based on the acquired corresponding relationship, in a case in which there is no board work capable of being performed on the board being conveyed in the work lane using the head currently being held by the head holding body while maintaining the priority order, and there is board work capable of being performed on the board being conveyed in the other lane using the head currently being held by the head holding body while maintaining the priority order, the controller is configured to set the other one of the first lane and the second lane as the work lane and perform the board work in the updated work lane without exchanging the head currently being held, and
wherein the board work is only performed in the work lane.

2. The board work device according to claim 1, wherein the heads include at least one of a mounting head configured to hold components and a dispensing head configured to dispense a viscous fluid on the board.

3. The board work device according to claim 1, wherein the heads include a head configured to exchangeably hold multiple types of nozzles, the nozzles being one of a suction nozzle configured to pick up a component or a dispensing nozzle configured to dispense viscous fluid on the board.

4. The board work device according to claim 1, wherein in a case in which there is no board work capable of being performed on the board being conveyed in the work lane using the head currently being held while maintaining the priority order and no board is being conveyed in the other lane, the controller is configured not to exchange the head currently being held until the board is conveyed in the other lane, if the time until the board is conveyed in the other lane is less than a specified threshold value.

5. The board work device according to claim 1, wherein the controller is configured to acquire conveyance information related to conveyance of the board in the other lane, and wherein, in a case in which there is no board work capable of being performed on the board being conveyed in the work lane using the head currently being held while maintaining the priority order and no board is being conveyed in the other lane, the controller is configured to determine whether to exchange the head currently being held without waiting for the board to be conveyed in the other lane, based on the conveyance information.

6. The board work device according to claim 1, wherein in a case in which there is no board work capable of being performed on the board being conveyed in the work lane using the head currently being held while maintaining the priority order and no board is being conveyed in the other lane, the controller is configured to perform board work on the board conveyed in work lane after exchanging the head currently being held without waiting for the board to be conveyed in the other lane, if there is no board work capable of being performed on the board being conveyed in the other lane using the head currently being held by the head holding body while maintaining the priority order.

* * * * *